United States Patent
Ellis

(10) Patent No.: US 6,579,765 B1
(45) Date of Patent: Jun. 17, 2003

(54) METAL OXIDE SEMICONDUCTOR FIELD EFFECT TRANSISTORS

(75) Inventor: John N. Ellis, Tavistock (GB)

(73) Assignee: Zarlink Semiconductor Limited (GB)

( * ) Notice: Subject to any disclaimer, the term of this patent is extended or adjusted under 35 U.S.C. 154(b) by 0 days.

(21) Appl. No.: 09/657,432

(22) Filed: Sep. 7, 2000

(30) Foreign Application Priority Data

Sep. 30, 1999 (GB) ............................................. 9923001

(51) Int. Cl.[7] ............................................... H01L 29/78
(52) U.S. Cl. ...................................... 438/270; 438/305
(58) Field of Search ............................... 438/270–272, 438/299–305

(56) References Cited

U.S. PATENT DOCUMENTS

| | | | |
|---|---|---|---|
| 5,342,796 A | * | 8/1994 | Ahn et al. |
| 5,448,094 A | * | 9/1995 | Hsu |
| 5,552,329 A | | 9/1996 | Kim et al. |
| 5,583,064 A | | 12/1996 | Lee et al. |
| 5,712,503 A | | 1/1998 | Kim et al. |
| 5,814,544 A | | 9/1998 | Huang |
| 6,130,454 A | * | 10/2000 | Gardner et al. ............. 438/270 |
| 6,171,916 B1 | * | 1/2001 | Sugawara et al. .......... 438/259 |
| 6,261,909 B1 | * | 7/2001 | Gardner et al. ............. 438/270 |

FOREIGN PATENT DOCUMENTS

| | | |
|---|---|---|
| EP | 615 282 A2 | 9/1994 |
| GB | 2 103 013 A | 2/1983 |
| WO | WO 98/12753 | 3/1998 |

* cited by examiner

Primary Examiner—Jey Tsai
(74) Attorney, Agent, or Firm—Kirschstein, et al.

(57) ABSTRACT

A method of fabricating a Metal Oxide Semiconductor Field Effect Transistor (MOSFET) device with an elevated source 29 and drain 30. A MOSFET region is defined on the surface of a silicon substrate 18, and a central area of that region removed by etching down to a predefined depth. Raised areas 29,30 on either side of the resulting recess 25 are doped to form the drain and a source, such that an active channel of the MOSFET device is provided wholly beneath the base of the recess 25.

9 Claims, 7 Drawing Sheets

METAL OXIDE SEMICONDUCTOR FIELD EFFECT TRANSISTORS

The present invention relates to metal oxide semiconductor field effect transistors (MOSFETs) and more particularly to MOSFETs having elevated sources and drains.

MOSFETs fabricated in silicon usually have a generally planar structure as illustrated in FIG. 1. The MOSFET device is formed in a region of silicon 1 surrounded by a silicon oxide barrier 2. The barrier 2 is formed using a self-aligned oxidation process in which surface regions of the silicon wafer are oxidised, and the resulting silicon oxide expands to extend above the wafer surface. Within the active region 1, a gate oxide 3 is grown on top of the MOSFET channel 4 and a metal gate 5 deposited on top of the gate oxide 3. At each end of the channel 4, a lightly doped region 6 is formed in the planar wafer surface by implantation, before sidewall spacers 7 (usually silicon oxide) are formed on either side of the metal gate 5. Heavily doped source and drain regions 8,9 are formed in the wafer surface, i.e. in the same plane as the lightly doped regions 6 and the channel 4, by contact diffusion.

Although the structure of the MOSFET shown in FIG. 1 represents a standard MOSFET design, it still presents a number of serious problems. Firstly, transistors made to this design suffer from so-called "short channel" effects when the gate length (i.e. the distance between the heavily doped drain regions 8,9) is very short. Where high electric fields are present, electrons can be accelerated to their maximum velocity within the channel 4. At this velocity, and in the high electric fields next to the drain 9, hot electrons can damage the insulating gate oxide 3 as well as cause increased leakage currents through ionisation. The electric field ionises electrons and holes near the drain site of the device which can lead to damage in the vicinity of the drain. Charges can build up as a consequence of this damage, reducing parameters such as gain (beta) or transconductance ($g_m$). FIG. 2 illustrates the current flow along the surface of a planar MOSFET device.

Another problem presented by the MOSFET structure of FIG. 1 is the classic short-channel effect. This conventional short channel effect arises due to the depletion region which is formed in any semiconductor diode junction. In a MOSFET, the drain to channel region gives rise to just such a diode and therefore has a depletion region surrounding it. As the drain voltage increases, as would be the case for a MOSFET wired into a functional circuit, the depletion region spreads outwards. This removes charge from under the gate region and lowers the threshold voltage for the device. In the extreme, the depletion region lowers the threshold so much that the transistor enters a triode-like mode of operation known as "punch-through".

A further problem with MOSFETs of the type shown in FIG. 1 results from the method used to provide electrical contact to the source and drain regions 8,9. Typically, technologies of 0.35 microns and below use silicide material to form a low resistance path from the metal connectors to the contact diffusion 8,9. FIG. 3 illustrates a typical MOSFET with silicided source, drain (and gate), where the silicide regions are indicated by reference numeral 10. The material which forms the silicide 10 (e.g. titanium) is deposited onto the source and drain 8,9 and subsequently processed so that the material forms a silicide region. This process requires the surface of the source/drain to react with the deposited material and a proportion of the original source/drain 8,9 is consumed. As the source and drain 8,9 are made shallower, the volume of silicon available to form a silicide, whilst still retaining the electrical diode junction, is reduced. In order to main the characteristics of the MOSFET, the silicon has to be topped up with an epitaxial layer, or the junctions have to be made deeper than would otherwise be optimal.

An alternative MOSFET structure has been proposed and has been presented as overcoming the problems of planar MOSFETs as described above. This alternative structure is known is an "elevated" source and drain structure. An elevated source-drain MOSFET is illustrated in FIG. 4 and can be seen to comprise a planar base layer 11 in which an active channel 13 is defined between two lightly doped regions 14. The heavily doped source and drain regions 15,16 lie above this planar region and more particularly above the plane of the active channel 13. The metal gate 17 is formed above the active channel 13 and between the source 15 and drain 16.

It has been shown that the elevated source-drain MOSFET can offer improved resistance against hot electron damage by moving the drain diffusion 16 away from the main current flow path. The elevated source and drains 15,16 also provide additional material available for silicidation allowing a lower resistance silicide to be formed even in transistors with junctions of less than 0.1 microns. Finally, by moving the heavily doped drain 16 away from the channel region 14, the spread of the depletion region under the gate 17 is eliminated or at least substantially reduced. The parasitic junction capacitance is also reduced as the total surface area of the junction is reduced and the overall performance of the MOSFET is enhanced.

A number of elevated source drain MOSFET structures have been proposed: see for example (1) Wakabayashi, H. "A High Performance 0.1 micron CMOS with Elevated Silicide Using Novel SI-SEG Process", IEDM, 1997, pp97–102; (2) Shibata, H. "High Performance Half-Micron PMOSFETS with 0.1 micron Shallow PN Junctions Utilising Selective Silicon Growth and Rapid Thermal Annealing", IEDM, 1987, pp590–593: (3) Mazure, C. "Facet Engineered Elevated Source Drains by Selective Si Epitaxy for 0.35 micron MOSFETs", SSDM, 1195, pp538–539; and (4) Chau, M. "Low Resistance Ti or Co Silicided Raised Source/Drain Transistors for Sub 013 m CMOS Technology", IEDM, 1997, pp103–107. In these earlier proposals, the elevated source and drain are formed by epitaxially growing additional silicon on top of a planar silicon substrate. A problem with this approach is that an epitaxial silicon deposition reactor is required. Furthermore, the selective deposition of silicon is difficult to control and is a technique which is rarely, if ever, used in production.

It is an object of the present invention to overcome or at least mitigate the above noted disadvantages of existing elevated source-drain MOSFET structures. This and other objects are achieved at least in part by forming an elevated source-drain structure by etching into a substantially planar silicon substrate to form a recessed channel region between the source and drain.

According to a first aspect of the present invention there is provided a method of fabricating a Metal Oxide Semiconductor Field Effect Transistor (MOSFET) device, the method comprising the steps of:

defining a MOSFET region on the surface of a semiconductor substrate;

removing a central area of said MOSFET region down to a predefined depth to form a recess in the substrate; and doping areas on either side of said recess to provide a drain and a source, wherein the active channel of the MOSFET device is provided wholly beneath a planar base of said recess.

Embodiments of the present invention provide a fabrication method which is simplified relative to existing methods of fabricating elevated source-drain MOSFETs.

It will be appreciated that the invention is not limited by the order in which the steps of the method of the invention have been presented. The steps may be carried out in any suitable order.

Preferably, the semiconductor substrate in which the MOSFET is fabricated is a silicon substrate. More preferably, the step of removing a central area of said MOSFET region comprises oxidising a region of silicon at the surface of the wafer and removing at least a part of the resulting oxide by etching.

Preferably, the method comprises controlling the steps of oxidation and/or etching such that said recess has sloping side walls. More preferably, said side walls slope at an angle of 45° relative to the surface of the silicon wafer, with the recess being wider at its upper end relative to its lower end.

Preferably, the method comprises the steps of:
(1) forming a layer of silicon oxide on the surface of a silicon substrate;
(2) forming a masking layer on the surface of the silicon oxide;
(3) patterning the masking layer to expose a region of silicon oxide;
(4) further oxidising a region of the silicon substrate beneath the exposed region of silicon oxide;
(4) etching away said exposed region of silicon oxide and at least a part of the underlying silicon oxide.

More preferably, said masking layer is a layer of silicon nitride. The masking layer may additionally be used to provide a mask for forming an isolation barrier around the periphery of the MOSFET device.

More preferably, the method comprises the further steps of:
(6) forming a gate above the etched region;
(7) doping source and drain regions of the silicon substrate on either side of the etched region; and
(8) forming respective electrical contacts with the source and drain regions.

Steps (6) to (8) may each comprise multiple sub-steps and may be performed in any suitable order.

Preferably, the method of the present invention comprises in sequence:
forming said recess in the substrate;
forming a gate in said recess;
lightly doping source and drain regions adjacent to the base of said recess;
forming gate sidewalls of an insulating material such that the sidewalls cover a fraction of the doped source and drain regions proximal to the gate; and
heavily doping the lightly doped source and drain regions except for the fractions masked by the gate sidewalls.

In order to enable electrical contact to the source, drain, and gate regions, the surfaces of these regions may be silicided.

According to a second aspect of the present invention there is provided a MOSFET device fabricated using the method of the above first aspect of the present invention.

According to a third aspect of the present invention there is provided a Metal Oxide Semiconductor Field Effect Transistor (MOSFET) device in a region of a semiconductor substrate, the device comprising:
a central region provided by a recess in the substrate; and
doped source and drain regions on either side of said recess,
wherein the active channel of the MOSFET device is provided wholly beneath a planar base of said recess.

Preferably, the active channel of the MOSFET lies wholly beneath a substantially planar base of said recess.

Preferably, said source and drain regions each comprise a lightly doped region in contact with the active channel and a heavily doped region in contact with the lightly doped region and lying substantially above the lightly doped region. More preferably, each said lightly doped region lies beneath the plane of the base of the recess.

For a better understanding of the present invention and in order to show how the same may be carried into effect reference will now be made, by way of example, to the accompanying drawings, in which.

Figure 1:
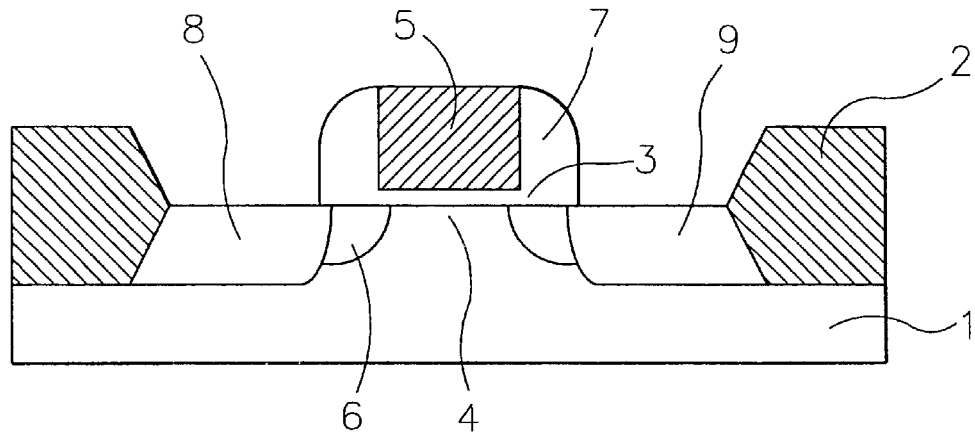
FIG. 1 illustrates schematically the structure of a conventional planar MOSFET device.
Figure 2:
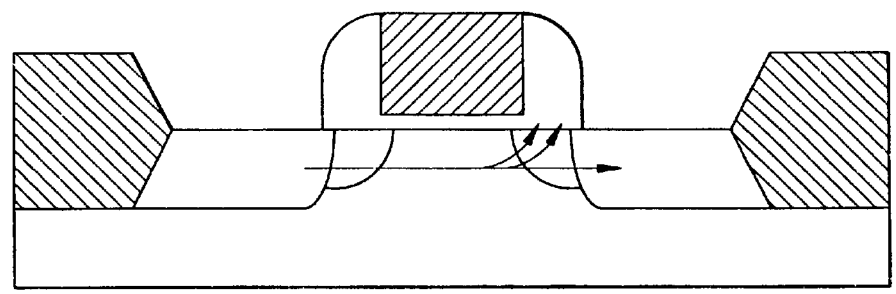
FIG. 2 illustrates the flow of current in the device of FIG. 1.
Figure 3:
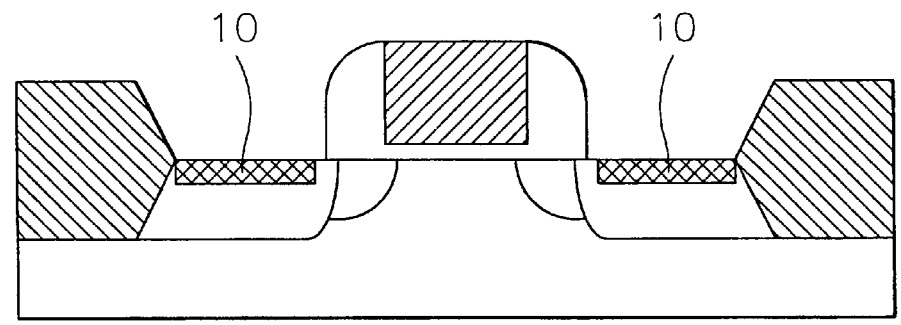
FIG. 3 illustrates a conventional MOSFET device with silicided source, drain, and gate.
Figure 4:
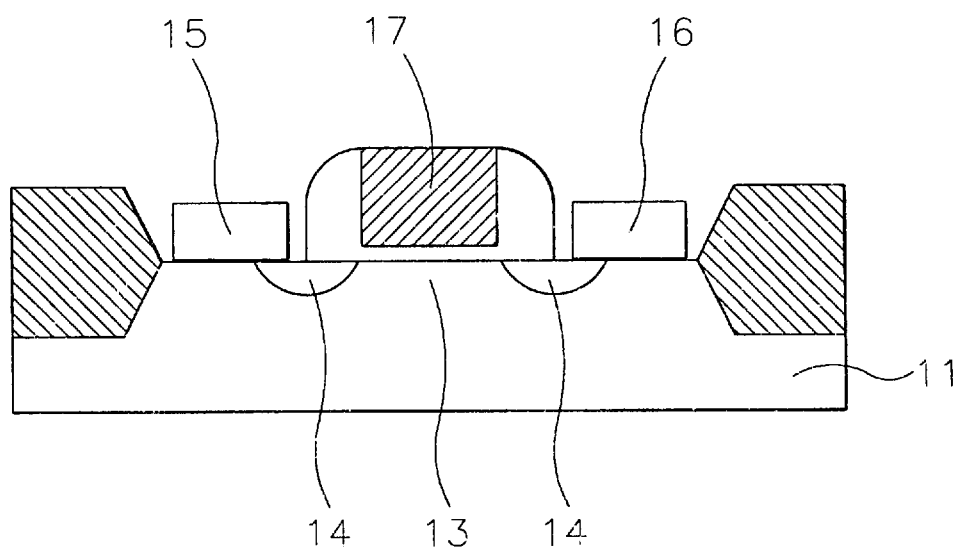
FIG. 4 illustrates a MOSFET device with elevated source and drain.

The planar structure of a conventional MOSFET device has been described above with reference to FIGS. 1 to 3. A MOSFET device having an elevated source-drain structure is illustrated in FIG. 4. There will now be described with reference to FIG. 5 an elevated source-drain MOSFET device and a method of manufacturing the same.

Figure 5A:
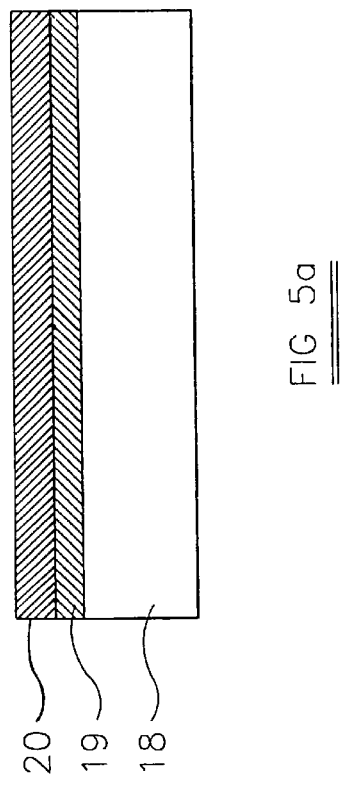
FIGS. 5a to 5o illustrate stages in the manufacture of an elevated source-drain MOSFET device.
Figure 5B:
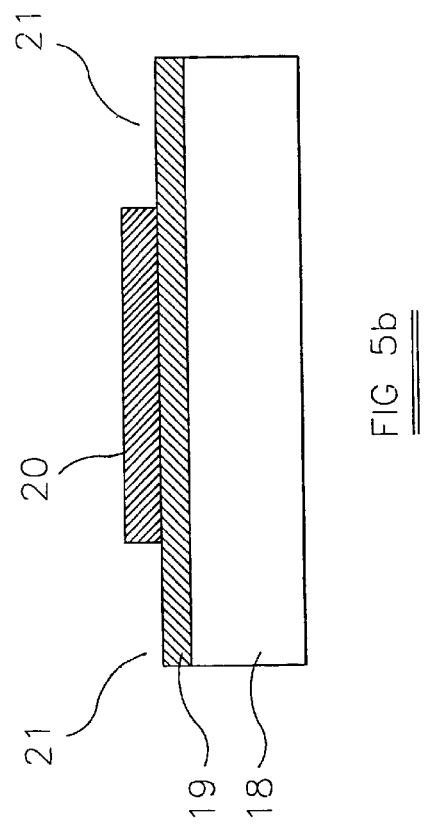
Figure 5C:
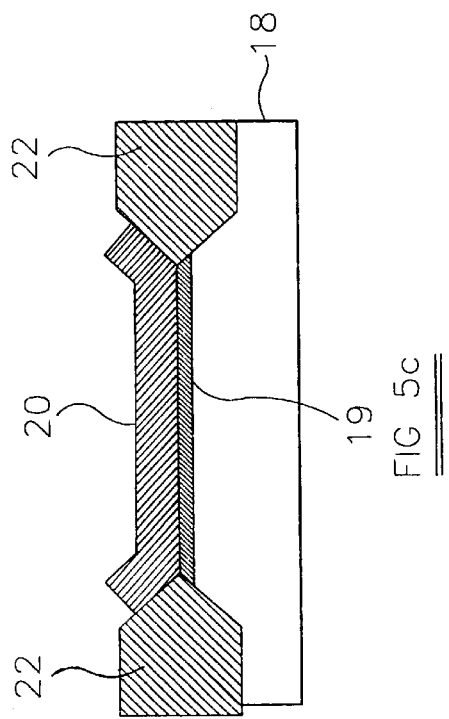
Figure 5D:
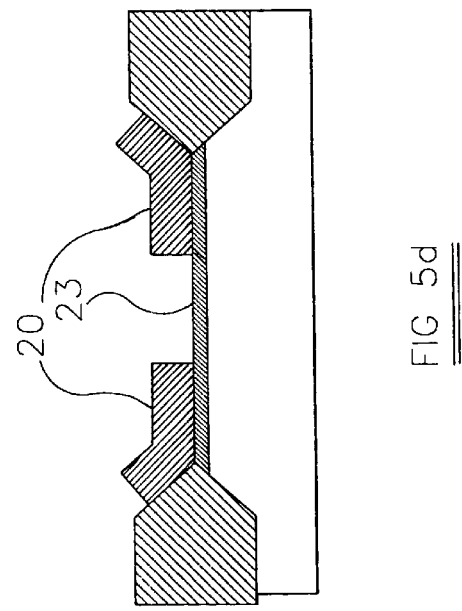
Figure 5E:
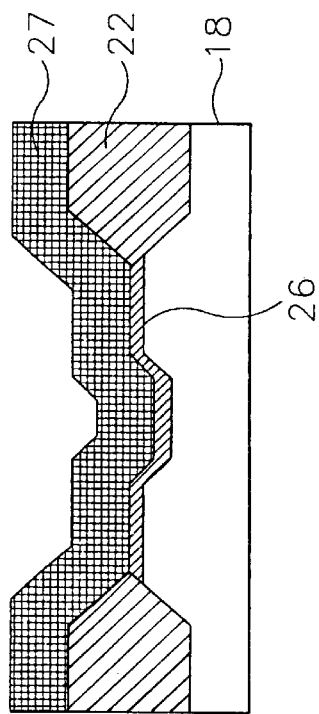
Figure 5G:
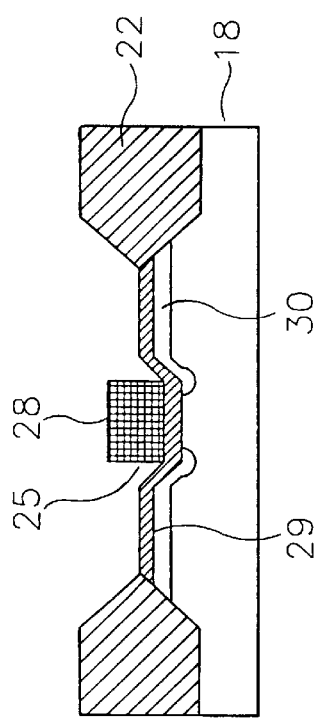
Figure 5F:
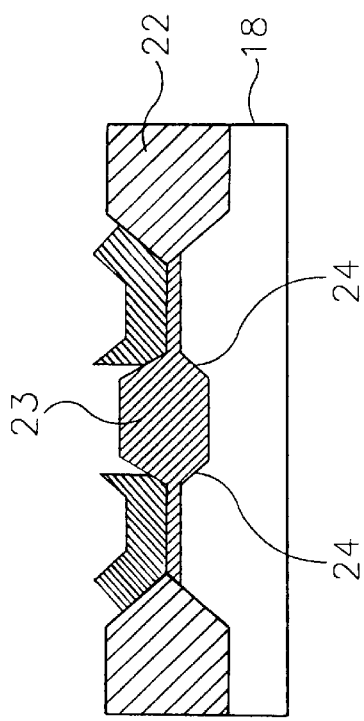
Figure 5H:
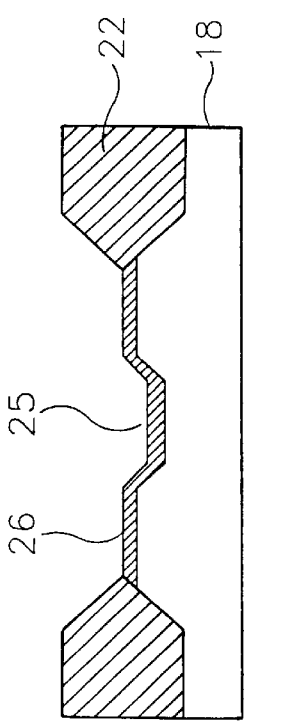
Figure 5I:
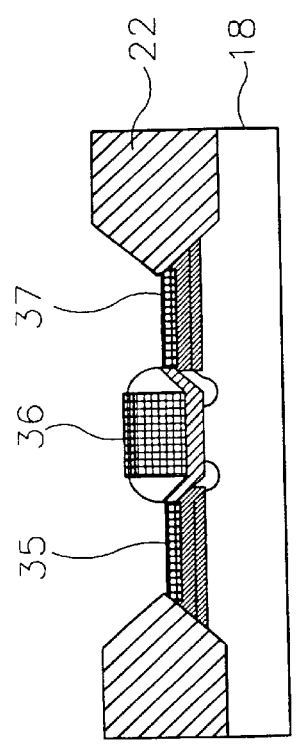
Figure 5K:
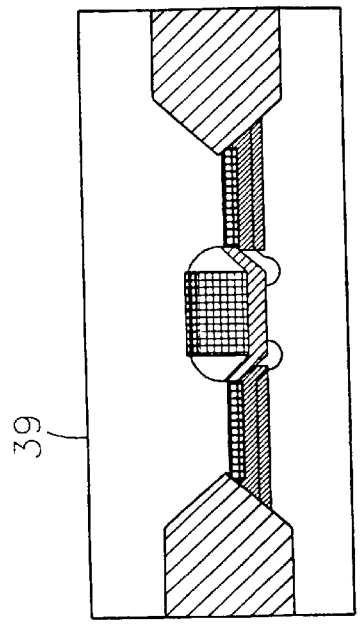
Figure 5J:
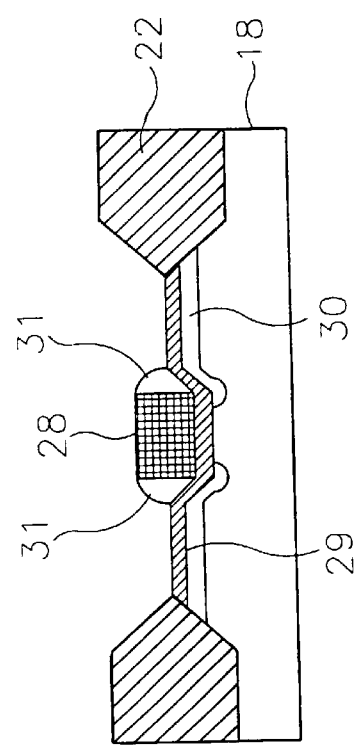
Figure 5L:
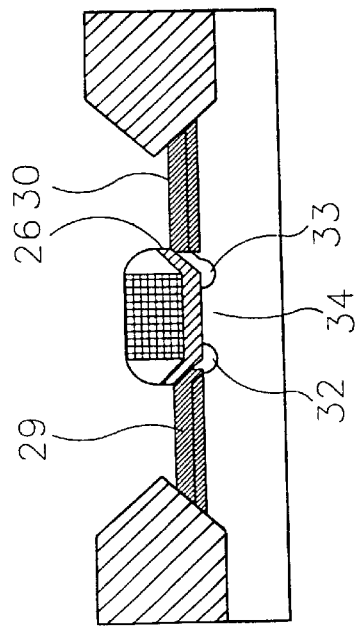
Figure 5O:
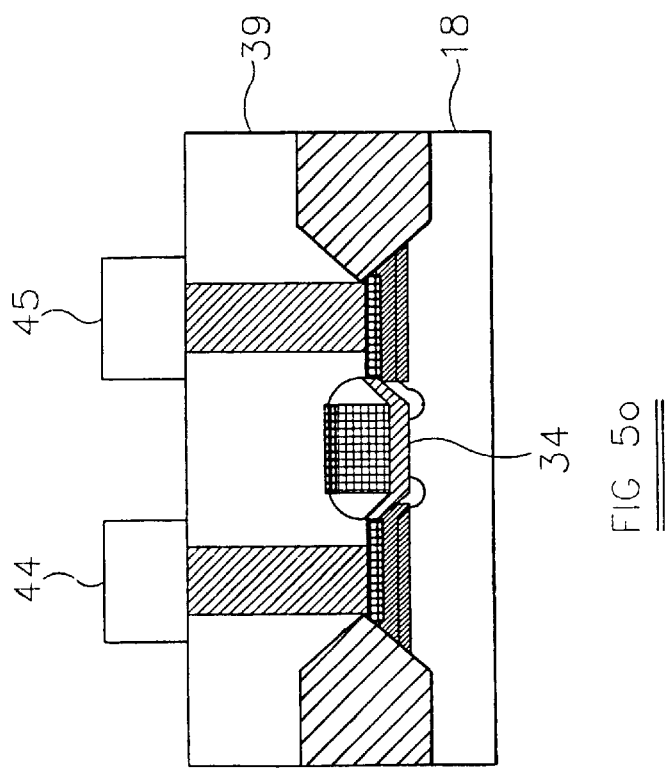
Figure 5M:
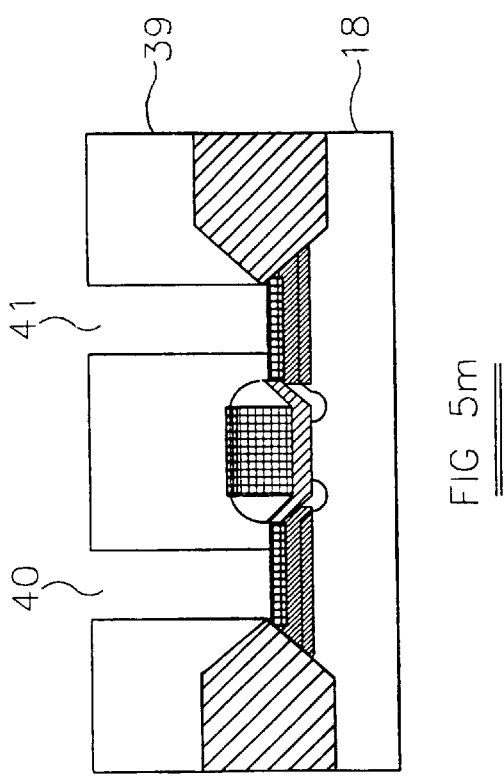
Figure 5N:
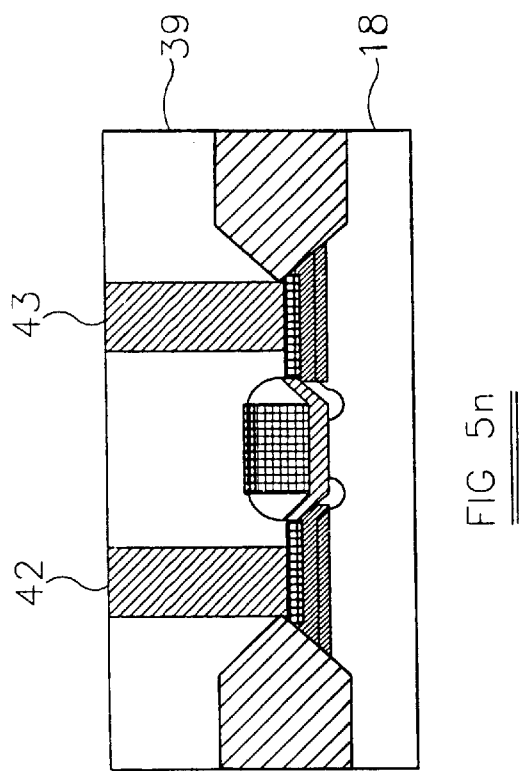

FIGS. 5a to 5o illustrate the various stages in the fabrication of an elevated source-drain MOSFET device in which the active channel is provided beneath a recess formed in a semiconductor substrate.

FIG. 5a

The MOSFET device is fabricated in a planar silicon wafer 18 on which is formed first and second dielectric masks 19,20. The first dielectric mask 19 is formed by oxidising the surface of the silicon wafer to form a thin layer of silicon oxide, whilst the second dielectric mask 20 is formed by depositing a layer of silicon nitride onto the previously oxidised surface 19.

FIG. 5b

A region 21 of the silicon oxide layer 19 is exposed by selectively etching the nitride layer 20 using a patterned photoresist (not shown in the Figures).

FIG. 5c

The oxide layer 19 is then "grown" into the substrate to a predefined depth to form an isolation barrier 22 surrounding the MOSFET device.

FIG. 5d

The silicon nitride masking layer 20 is then further patterned to expose a region 23 of the silicon oxide layer 19 in the center of the MOSFET device.

FIG. 5e

The exposed region 23 of silicon oxide is then grown into the substrate 18 to a predefined depth. It is noted that the outer edges 24 of the central silicon oxide region 23 are chamfered at an angle of approximately 45°.

FIG. 5f

The silicon nitride masking layer 20 is then removed, together with the bulk of the central silicon oxide region 23. The result is that a recess 25 is formed in the center of the MOSFET device region, with a thin coating of silicon oxide 26 coating the base and sidewalls of the recess 25, as well as the area of the substrate surrounding the recess 25.

FIG. 5g

A thick layer of polysilicon 27 is grown over the surface of the device.

FIG. 5h

Using a phbtolithographically defined mask (not shown), the polysilicon 27 is removed except for a region 28 on top of the recess. This region of polysilicon 28 forms the gate of the MOSFET device. Ion beam implantation is used to provide lightly doped source and drain regions 29,30 on either side of the central recess 25.

FIG. 5i

A layer of silicon oxide is deposited on top of the device, and is etched back to leave oxide sidewalls 31 around the gate polysilicon 28.

FIG. 5j

The silicon oxide 26 above the source and drain regions 29,30 is removed by etching, and a further heavy doping of the source and drain regions 29,30 carried out. Only the regions 32,33 on either side of the active channel region 34, and which are masked by the gate sidewalls 31, are left lightly doped.

FIG. 5k

The surfaces of the gate, source, and drain are silicided to form silicide regions 35,36, and 37.

FIG. 5i

The substrate is coated with a thick layer of silicon oxide 39. The surface of the oxide is then planarised by polishing.

FIG. 5m

The silicided surfaces of the source and drain are exposed by etching through the silicon oxide layer to form deep contact channels 40,41.

FIG. 5n

The etched channels 40,41 to the source and drain are filled with tungsten plugs 42,43.

FIG. 5o

Surface contacts 44,45 to the tungsten plugs 42,43 are defined by metalisation and etching.

From the resulting MOSFET device structure illustrated in FIG. 5o, it will be apparent that the active channel 34 is below the level of the heavily doped source and drain 29,30. It will be appreciated that the depth of the silicide on top of the source and drain can be deeper than that which is possible with a conventional planar structure.

Figure 6:
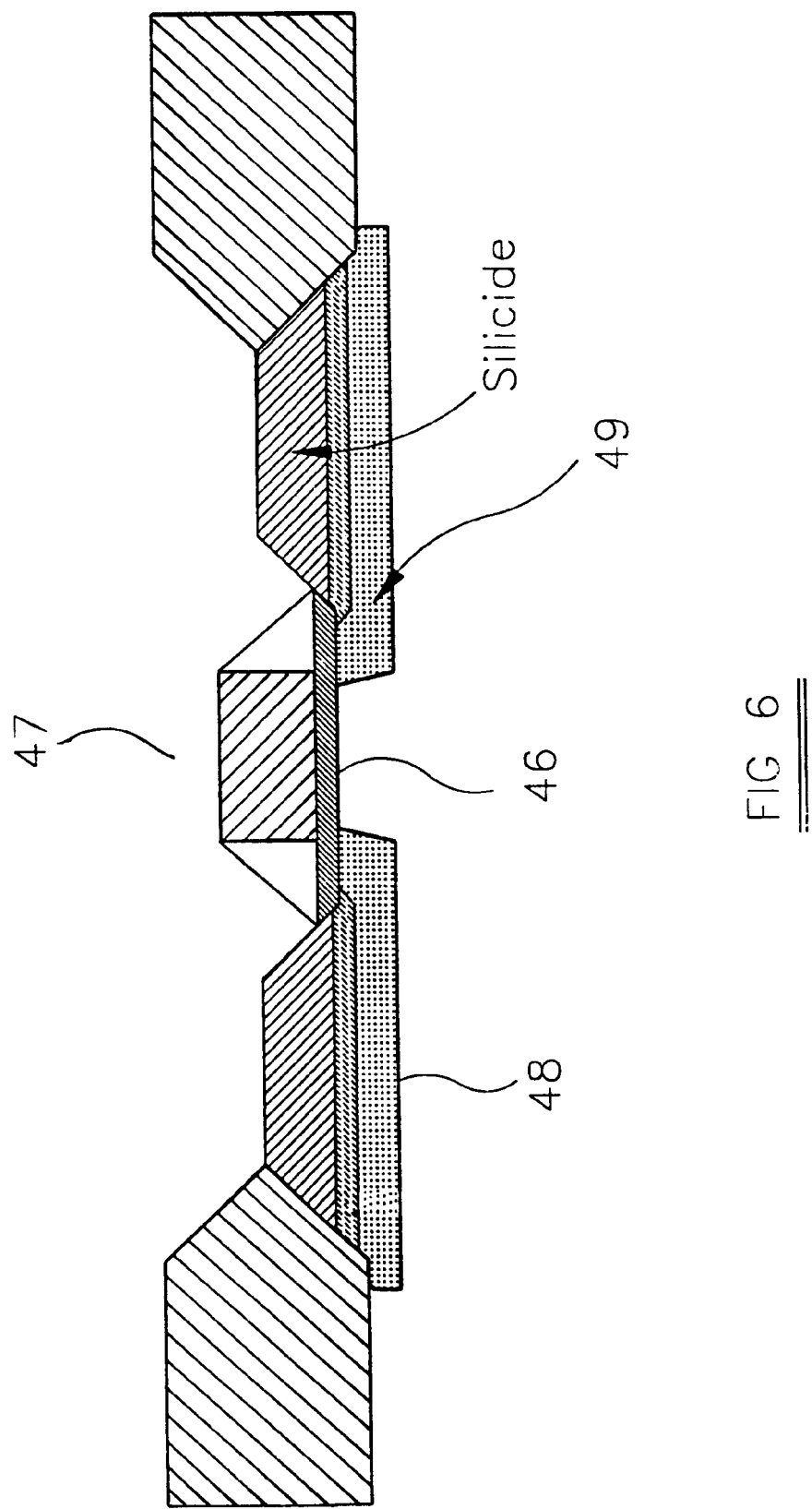
FIG. 6 illustrates an alternative MOSFET structure according to an embodiment of the present invention.

FIG. 6 illustrates a modified MOSFET structure in which the active channel 46 lies wholly beneath the planar base of the polysilicon gate 47, and the lightly doped source and drain regions 48,49 lie beneath the plane of the base of the gate 47. It will be appreciate that this structure has advantages over the structure of FIG. 5n, as in the former the heavily doped source and drain regions have a greater depth, allowing for an increased silicidation depth, whilst in the latter this depth is limited due to the encroachment of the lightly doped regions up the sidewalls of the recess.

It will be appreciated that the present invention is applicable in particular, although not necessarily, to complementary metal oxide semiconductor (CMOS) technology as well as to related technologies which use thin semiconductor films. The invention is also applicable to techniques which utilise bulk semiconducting films, BiCMOS and bipolar technologies.

It will be appreciated by the person of skill in the art that modifications may be made to the above described embodiments without departing from the scope of the present invention. For example, it will be appreciated that other methods may be used to form the recess which separates the elevated source 29 and drain 30. For example, it may be possible to etch directly into the silicon substrate without requiring the intermediate step of forming the silicon oxide region. The sloping side walls may be formed using a directional wet etch. In another alternative, the central recess may be formed by a dry etch process. The actual structure of the MOSFET device may also be modified. For example, the isolating barrier regions may replaced with shallow or deep trench isolating regions.

What is claimed is:

1. A method of fabricating a metal oxide semiconductor field effect transistor (MOSFET) device, the method comprising the steps of:
   a) defining a MOSFET region on a surface of a semiconductor substrate;
   b) removing a central area of the MOSFET down to a predefined depth to form a recess having a planar base lying in a plane;
   c) providing an active channel of the MOSFET device wholly beneath said planar base of the recess; and
   d) on each side of the recess, providing a planar lightly doped region lying wholly beneath the plane in which said planar base lies, the lightly doped region extending underneath the recess, a planar heavily doped region directly above said lightly doped region, and a planar silicide region directly above said heavily doped region.

2. The method according to claim 1, and forming the semiconductor substrate in which the MOSFET is fabricated as a silicon substrate.

3. The method according to claim 1, wherein the method comprises oxidizing a region of silicon at the surface of the substrate, and removing at least a part of a resulting oxide by etching, and controlling at least one of the steps of oxidizing and etching such that the recess has sloping sidewalls.

4. The method according to claim 3, wherein the sidewalls slope at an angle of substantially 45° relative to the surface of the silicon substrate, with the recess being wider at its upper end relative to its lower end.

5. The method according to claim 1, and further comprising the steps of forming a layer of silicon oxide on the surface of the semiconductor substrate formed of silicon, forming a masking layer on the surface of the silicon oxide, patterning the masking layer to expose a region of the silicon oxide, further oxidizing a region of the silicon substrate beneath the exposed region of the silicon oxide, and etching away the exposed region of the silicon oxide and at least a part of the underlying silicon oxide to form an etched region.

6. The method according to claim 5, and forming the masking layer as a layer of silicon nitride.

7. The method according to claim 5, and further comprising the steps of forming a gate above the etched region, doping source and drain regions of the silicon substrate on either side of the etched region, and forming respective electrical contacts with the source and drain regions.

8. The method according to claim 1, and further comprising in sequence the steps of forming the recess in the substrate; forming a gate region in the recess; lightly doping source and drain regions adjacent to the base of the recess; forming gate sidewalls of an insulating material such that the sidewalls cover a fraction of the doped source and drain regions proximal to the gate region; and heavily doping the lightly doped source and drain regions except for the fractions masked by the gate sidewalls.

9. The method according to claim 8, and further comprising the step of silicide the source, drain, and gate regions.

* * * * *